US007016384B2

(12) United States Patent
Asano

(10) Patent No.: US 7,016,384 B2
(45) Date of Patent: Mar. 21, 2006

(54) SECOND-HARMONIC GENERATION DEVICE USING SEMICONDUCTOR LASER ELEMENT HAVING QUANTUM-WELL ACTIVE LAYER IN WHICH RESONATOR LENGTH AND MIRROR LOSS ARE ARRANGED TO INCREASE WIDTH OF GAIN PEAK

(75) Inventor: Hideki Asano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 110 days.

(21) Appl. No.: 10/386,528

(22) Filed: Mar. 13, 2003

(65) Prior Publication Data
US 2003/0174745 A1 Sep. 18, 2003

(30) Foreign Application Priority Data

| Mar. 14, 2002 | (JP) | ............................. 2002/069393 |
| Mar. 15, 2002 | (JP) | ............................. 2002/072269 |
| Mar. 22, 2002 | (JP) | ............................. 2002/081088 |

(51) Int. Cl.
*H01S 5/00* (2006.01)
*H01S 3/10* (2006.01)
*H01S 3/13* (2006.01)

(52) U.S. Cl. .................. 372/43.01; 372/21; 372/22; 372/29.02

(58) Field of Classification Search ................ 372/43, 372/21, 22, 50, 45, 47, 54, 44, 43.01
See application file for complete search history.

(56) References Cited

U.S. PATENT DOCUMENTS 5,530,713 A    6/1996  Fukagi

| 6,298,078 | B1 * | 10/2001 | He ............................... 372/45 |
| 6,396,861 | B1 * | 5/2002 | Shimizu et al. ............... 372/45 |
| 6,621,845 | B1 * | 9/2003 | Fukunaga .................... 372/46 |
| 2002/0009102 | A1 * | 1/2002 | Hayakawa .................... 372/22 |
| 2002/0041613 | A1 * | 4/2002 | Yoshida et al. ............... 372/46 |

FOREIGN PATENT DOCUMENTS

| JP | 5-37078 | 2/1993 |
| JP | 5-275801 | 10/1993 |
| JP | 6-077588 | 3/1994 |
| JP | 411074607 A | * 3/1999 |
| JP | 2000307192 A | * 11/2000 |

OTHER PUBLICATIONS

Pprek et al, What limits the maximum output power of long-wavelength AlGaInAs/InP laser diodes?, Sep. 2002, IEEE Journal of Quantum Electronics, vol. 38, No. 9, pp 1253-1259.*

* cited by examiner

*Primary Examiner*—Minsun Oh Harvey
*Assistant Examiner*—Armando Rodriguez
(74) *Attorney, Agent, or Firm*—Sughrue Mion, PLLC

(57) ABSTRACT

A second-harmonic generation device includes a semiconductor laser element which has a quantum-well active layer, a wavelength control means which controls the wavelength of the light emitted from an end facet of the semiconductor laser element, an optical system which returns to the semiconductor laser element the light the wavelength of which is controlled by the wavelength control means, and a wavelength conversion element which is directly coupled to the other end facet of the semiconductor laser element, and converts the wavelength of the light controlled by the wavelength control means, to a half wavelength. The semiconductor laser element has a resonator length equal to or greater than 900 micrometers and a mirror loss equal to or greater than 16 cm$^{-1}$.

8 Claims, 12 Drawing Sheets

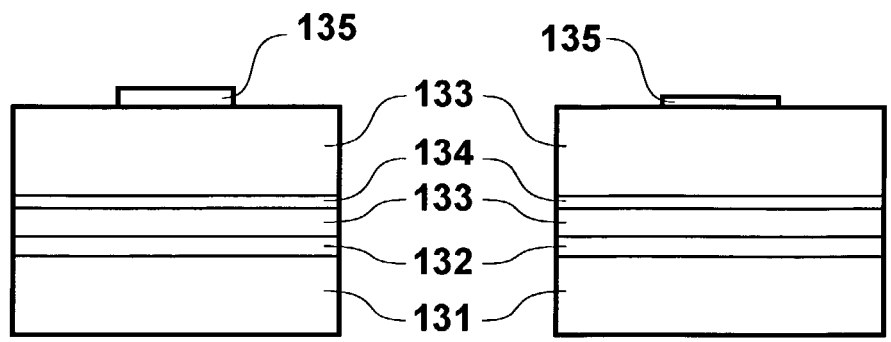
FIG.6A  FIG.6D
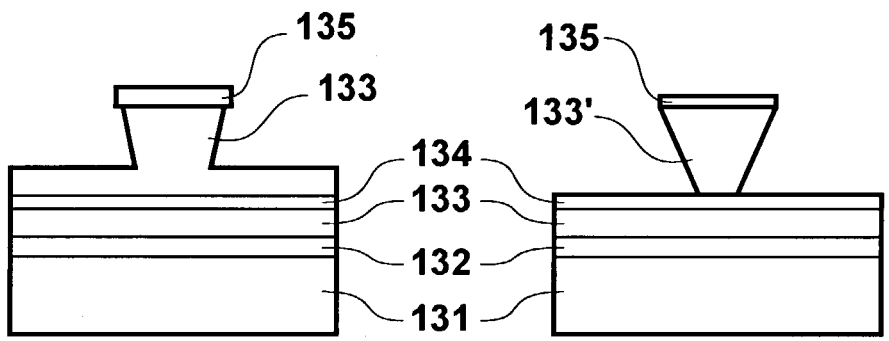
FIG.6B  FIG.6E
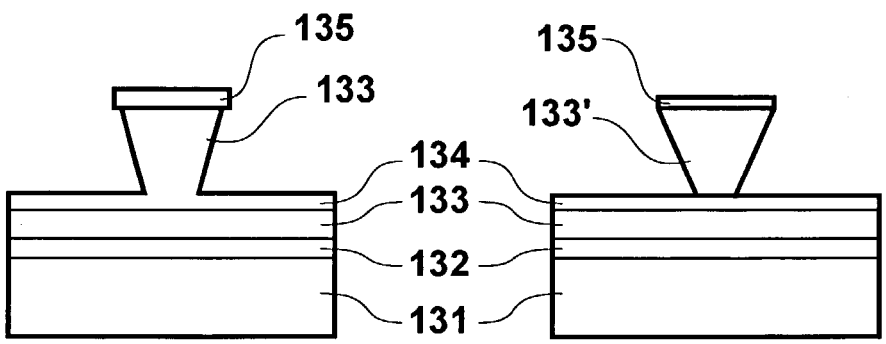
FIG.6C  FIG.6F

SECOND-HARMONIC GENERATION DEVICE USING SEMICONDUCTOR LASER ELEMENT HAVING QUANTUM-WELL ACTIVE LAYER IN WHICH RESONATOR LENGTH AND MIRROR LOSS ARE ARRANGED TO INCREASE WIDTH OF GAIN PEAK

BACKGROUND OF THE INVENTION

1. Field of the Invention

The present invention relates to a second-harmonic generation device having a semiconductor laser element and a wavelength conversion element which converts the wavelength of light emitted from the semiconductor laser element to a half wavelength. In addition, the present invention relates to a semiconductor laser element, and particularly to a semiconductor laser element having an InGaP cladding layer above a GaAs substrate.

2. Description of the Related Art (1) Laser devices which are constituted by a semiconductor laser element and a wavelength conversion element and emit light having a blue or green wavelength have been developed, where the oscillation wavelength of the semiconductor laser element is in the 0.9 to 1.2 µm band, and the wavelength conversion element promotes generation of a second harmonic. For example, in some of the above laser devices, the wavelength conversion element has a waveguide structure made of $LiNbO_3$, the semiconductor laser element is directly coupled to the wavelength conversion element, and single-wavelength laser light emitted from the semiconductor laser element and matched with the wavelength conversion element is supplied to the wavelength conversion element. Thus, the wavelength of the laser light from the semiconductor laser element is converted to a half wavelength. However, the wavelength conversion element is very sensitive to the wavelength of the fundamental laser light, and the conversion efficiency greatly varies with a slight variation in the wavelength. Therefore, the intensity of the laser light after the wavelength conversion is likely to become unstable. Thus, when a semiconductor laser element is used in a fundamental-light source, the oscillation characteristics are required to be highly stable.

In consideration of the above problem, conventionally, distributed Bragg reflection-type lasers (DBR-LDs) or Fabry-Perot (FP) lasers being combined with a wavelength filter and having an arbitrarily controlled oscillation wavelength are mainly used as fundamental-light sources using a semiconductor laser element. The primary objective in the fundamental-light sources using the Fabry-Perot (FP) lasers is to stably control the oscillation wavelength, and various research organizations are currently making an attempt to stabilize the oscillation wavelength of the semiconductor laser element. In one of such an attempt, only a portion within a narrow line width of light emitted from the semiconductor laser element is returned by using a diffraction grating or etalon so as to stabilize the wavelength and enhance coherence. When this technique is used, it is possible to overcome the problem of the semiconductor laser element that the wavelength is likely to vary. Thus, the above technique is effective in the fundamental-light sources which are used with a wavelength conversion element.

In the case where a semiconductor laser element is used for generating a fundamental harmonic in a second-harmonic generation device, the peak gain wavelength of the semiconductor laser element is important. The gain peak in a wavelength spectrum of a semiconductor laser element has a certain width. When the width of the gain peak becomes smaller and the peak height becomes higher, the threshold becomes lower and the characteristics are improved. However, in the case where a semiconductor laser element having a small gain peak width is used as a light source, and the wavelength of the semiconductor laser element is controlled by external feedback of light, a width within which the wavelength can be varied becomes small. Therefore, when the gain peak width is small, and the difference between the peak gain wavelength of the semiconductor laser element and a control wavelength of the external light is increased, in some cases, it becomes impossible to fix the wavelength to a desired value.

In particular, the widths of gain peaks of semiconductor laser elements having a quantum-well active layer are smaller than those of the semiconductor laser elements having a conventional bulk active layer. Further, in the case of semiconductor laser elements which emit laser light in the wavelength range of 0.9 to 1.2 micrometers, the wavelengths in the wavelength range cannot be generated without a quantum-well structure, the gains are high, and the widths of gain peaks are small. Therefore, it is difficult to control the wavelengths in the wavelength range of 0.9 to 1.2 micrometers by using an external optical filter such as a diffraction grating.

(2) Since semiconductor laser elements are useful due to their small size, low price, high efficiency, low power consumption, and the like, the semiconductor laser elements are recently receiving attention in various fields, and are widely used, in particular, as light sources. Almost all of the currently available semiconductor laser elements are produced by forming fundamental layers including cladding layers, an active layer, a current confinement layer, a contact layer, and the like on a GaAs or InGaP substrate by crystal growth, and making a structure for mode control, current confinement, and the like through semiconductor processes including a lithography process, a machining process, and the like.

However, the material dependence of the semiconductor processes is high. In particular, shapes formed by wet etching processes vary depending on materials and crystal orientations. Therefore, when some materials are used, it is difficult to realize a desired shape.

As an example of the materials which are difficult to be processed is AlGaAs. For example, a semiconductor laser element in the 0.8 µm band is produced through the following processes. First, an n-type AlGaAs cladding layer, an active layer, a p-type AlGaAs cladding layer, and a p-type GaAs contact layer are formed on an GaAs substrate, and thereafter a ridge is formed by forming a mask on the layered structure and etching disclosed portions of the layered structure to a mid-thickness of the p-type AlGaAs cladding layer. In this case, since the width of the ridge is a very important parameter for controlling the semiconductor laser element in a transverse mode, the ridge is required to be precisely formed.

When the p-type AlGaAs cladding layer is etched for formation of the ridge, it is difficult to control the ridge shape since unignorable portions of the layered structure under the mask are etched in the lateral directions (i.e., unignorable side etching occurs). Therefore, in order to realize the above structure, it is necessary to control the mask width, the etching time, the temperature of an etching solution, and the like with high accuracy. In addition, even when these factors are accurately controlled, the ridge shapes formed in an actual manufacturing system vary depending on positions within each wafer surface. Thus, the yield rate becomes low, and the cost increases.

(3) The erbium-doped fiber amplifiers (EDFA) have been developed in the 1990s, and recently the communication capacities in wavelength-division-multiplex communications have been increasing. In this situation, the semiconductor lasers in the 0.98 μm band, which are used as excitation light sources in the EDFAs, are expected to have high optical output power and reliability.

In addition, high-output-power semiconductor lasers in the 1.02 μm and 1.05 μm bands are expected for use as excitation light sources in other fiber amplifiers.

Further, laser devices constituted by a semiconductor laser having an oscillation wavelength in the 0.9 to 1.1 μm band and a polarization-inverted-domain distribution element promoting generation of a second harmonic have been developed, where the laser devices emit light having a blue or green wavelength.

Thus, currently, various manufacturers are pursuing development of semiconductor lasers in the wavelength range of 0.9 to 1.1 μm, as disclosed in, for example, Japanese Unexamined Patent Publication, Nos. 06(1994)-077588, 05(1993)-275801, and 05(1993)-037078, and U.S. Pat. No. 5,530,713, and the like.

Although the above Japanese Unexamined Patent Publications mainly disclose improvements in layer structures and shapes of the semiconductor laser elements, the disclosed semiconductor laser elements are not optimized with respect to impurity doping concentrations. The impurity doping concentration is an important parameter for determining optical output power characteristics of semiconductor laser elements. In particular, when concentrations of p-type dopants are too high, optical loss and defects increase. On the other hand, when the concentrations of p-type dopants are too low, the barrier functions against electrons become weak, and therefore overflow is likely to occur during high output power operation. Normally, zinc (Zn) is used as a p-type dopant in a p-type InGaP cladding layer. However, since the mobility of Zn ions in InGaP is great, the Zn ions diffuse into an active layer, and become non-radiative recombination centers, which increase loss in a resonator and cause crystal defects.

SUMMARY OF THE INVENTION

The first object of the present invention is to provide a second-harmonic generation device which comprises a quantum-well semiconductor laser element oscillating in the 0.9 to 1.2 μm band, a wavelength conversion element, and a wavelength selection means, and stably operates even when the peak gain wavelength varies.

The second object of the present invention is to provide a reliable semiconductor laser element which can be produced at low cost through semiconductor processes including crystal growth and having high degree of freedom.

The third object of the present invention is to provide a semiconductor laser element in which a concentration of a p-type dopant is optimized so as to improve optical output power characteristics and reliability.

(1) According to the first aspect of the present invention, there is provided a second-harmonic generation device comprising: a semiconductor laser element which has a quantum-well active layer and first and second end facets opposite to each other, and emits light having a wavelength from the first end facet; a wavelength control means which controls the wavelength of the light emitted from the first end facet; an optical system which returns to the semiconductor laser element the light the wavelength of which is controlled by the wavelength control means; and a wavelength conversion element which is directly coupled to the second end facet of the semiconductor laser element, converts the wavelength of the light controlled by the wavelength control means, to a half wavelength, and outputs the light the wavelength of which is converted. The semiconductor laser element has a resonator length equal to or greater than 900 micrometers and a mirror loss equal to or greater than 16 cm$^{-1}$.

Preferably, in the second-harmonic generation device according to the first aspect of the present invention, the semiconductor laser element has an oscillation wavelength in a range from 0.9 to 1.2 micrometers.

Since the semiconductor laser element in the second-harmonic generation device according to the first aspect of the present invention has the resonator length equal to or greater than 900 micrometers and the mirror loss equal to or greater than 16 cm$^{-1}$, the width within which the oscillation wavelength (which is controlled by the wavelength control means) can be varied can be 10 nm or greater. Therefore, it is easy to control the wavelength to a desired value.

In addition, since the variation in the conversion efficiency in the combination of the semiconductor laser element and the wavelength conversion element can be reduced, it is possible to obtain a stable second harmonic. Further, since the wavelength control is easy, it is possible to increase the yield rate and reduce the cost.

In particular, when the resonator length is equal to or greater than 900 micrometers, it is possible to reduce the current density and prevent facet degradation which is caused by high current density. Therefore, the reliability can be increased.

Further, since the width of the gain peak of the semiconductor laser element having a quantum-well active layer is narrow, the first aspect of the present invention is advantageous. In particular, since the wavelength range of 0.9 to 1.2 micrometers cannot be achieved without the quantum-well active layer, it is desirable to apply the first aspect of the present invention to second-harmonic generation devices which use a semiconductor laser element emitting laser light in the wavelength range of 0.9 to 1.2 micrometers.

(2) According to the second aspect of the present invention, there is provided a semiconductor laser element comprising: an n-type first cladding layer; a p-type second cladding layer; and an active layer formed between the first and second cladding layers; where at least a portion of the first cladding layer and at least a portion of the second cladding layer are made of different materials, and the first and second cladding layers have approximately identical refractive indexes.

Preferably, the semiconductor laser element according to the second aspect of the present invention may also have one of the following additional features (i) to (iii).

(i) At least a portion of one of the first and second cladding layers is made of AlGaAs, and at least a portion of the other of the first and second cladding layers is made of InGaP.

(ii) At least a portion of one of the first and second cladding layers is made of AlGaAs, and at least a portion of the other of the first and second cladding layers is made of AlGaInP.

(iii) At least a portion of one of the first and second cladding layers is made of InP, and at least a portion of the other of the first and second cladding layers is made of AlGaInAs.

In the semiconductor laser element according to the second aspect of the present invention, at least a portion of the first cladding layer and at least a portion of the second cladding layer are made of different materials, and the first and second cladding layers have approximately identical refractive indexes. Therefore, it is possible to make an optical design which is equivalent to that of a semiconductor laser element in which a pair of cladding layers are made of an identical material. In addition, when one of the first and second cladding layers is required to be processed for current confinement and mode control, it is possible to use a material which is easy to process, for forming the one of the first and second cladding layers. That is, the degree of freedom in the design and the accuracy of the processing can be increased. Thus, high reliability can be achieved.

Further, it is possible to choose an optimum material in consideration of variations in crystallinity of the cladding layers and layers adjacent to the cladding layers depending on the compositions of the cladding layers. Thus, the crystallinity can be improved.

Furthermore, since the ease of processing simplifies the manufacturing process, the cost can be reduced.

(3) According to the third aspect of the present invention, there is provided a semiconductor laser element comprising: a substrate made of n-type GaAs; a lower cladding layer formed above the substrate and made of n-type AlGaAs; a lower optical waveguide layer formed above the lower cladding layer and made of n-type or undoped InGaAsP; a strained quantum-well active layer formed above the lower optical waveguide layer and made of InGaAs; an upper optical waveguide layer formed above the strained quantum-well active layer and made of undoped InGaAsP; and an upper cladding layer formed above the upper optical waveguide layer and made of p-type InGaP. Each of the lower and upper optical waveguide layers has such a composition as to realize a bandgap of 1.5 to 1.6 eV, the lower and upper optical waveguide layers have a total thickness of 100 to 200 nm, the upper cladding layer contains Zn as a dopant, and at least a portion of the upper cladding layer located nearer to the strained quantum-well active layer includes: a low-concentration sublayer having a Zn concentration of $1 \times 10^{15}$ to $1 \times 10^{17}$ cm$^{-3}$ and a thickness of 5 to 12 nm; and a high-concentration sublayer having a Zn concentration of $7 \times 10^{17}$ to $2 \times 10^{18}$ cm$^{-3}$ and being located farther from the active layer than the low-concentration sublayer.

When the semiconductor laser element is constructed as above, it is possible to increase the optical output power and reliability.

Specifically, when the bandgap of each of the lower and upper optical waveguide layers is arranged in the range of 1.5 to 1.6 eV, and the total thickness of the lower and upper optical waveguide layers is arranged in the range of 100 to 200 nm, light can be satisfactorily confined in the active layer, and the loss in the resonator can be reduced. Therefore, it is possible to decrease the threshold current density and further increase the optical output power.

In addition, when the upper cladding layer contains Zn as a dopant, and at least a portion of the upper cladding layer located nearer to the active layer includes a low-concentration sublayer having a Zn concentration of $1 \times 10^{15}$ to $1 \times 10^{17}$ cm$^{-3}$ and a thickness of 5 to 12 nm and a high-concentration sublayer having a Zn concentration of $7 \times 10^{17}$ to $2 \times 10^{18}$ cm$^{-3}$ and being located nearer to the active layer than the low-concentration sublayer, the degradation caused by diffusion of Zn ions into the active layer can be prevented. Therefore, it is possible to achieve higher optical output power and reliability.

DESCRIPTION OF THE DRAWINGS

FIGS. 6A to 6C are cross-sectional views of representative stages of a process of etching an AlGaAs cladding layer by using a mask.

FIGS. 6D to 6F are cross-sectional views of representative stages of a process of etching an InGaP cladding layer by using a mask.

DESCRIPTION OF PREFERRED EMBODIMENTS

Embodiments of the present invention are explained in detail below with reference to drawings.

First Embodiment

A second-harmonic generation device as the first embodiment of the present invention, which corresponds to the aforementioned first aspect of the present invention, is explained below.

First, a first example of a semiconductor laser element which constitutes the second-harmonic generation device as the first embodiment of the present invention is explained below with reference to FIG. 1, which is a cross-sectional view of the first example of the semiconductor laser element. (The entire construction of the second-harmonic generation device is explained later with reference to FIG. 3.)

The first example of a semiconductor laser element which constitutes the second-harmonic generation device as the first embodiment is formed as follows.

Figure 1:
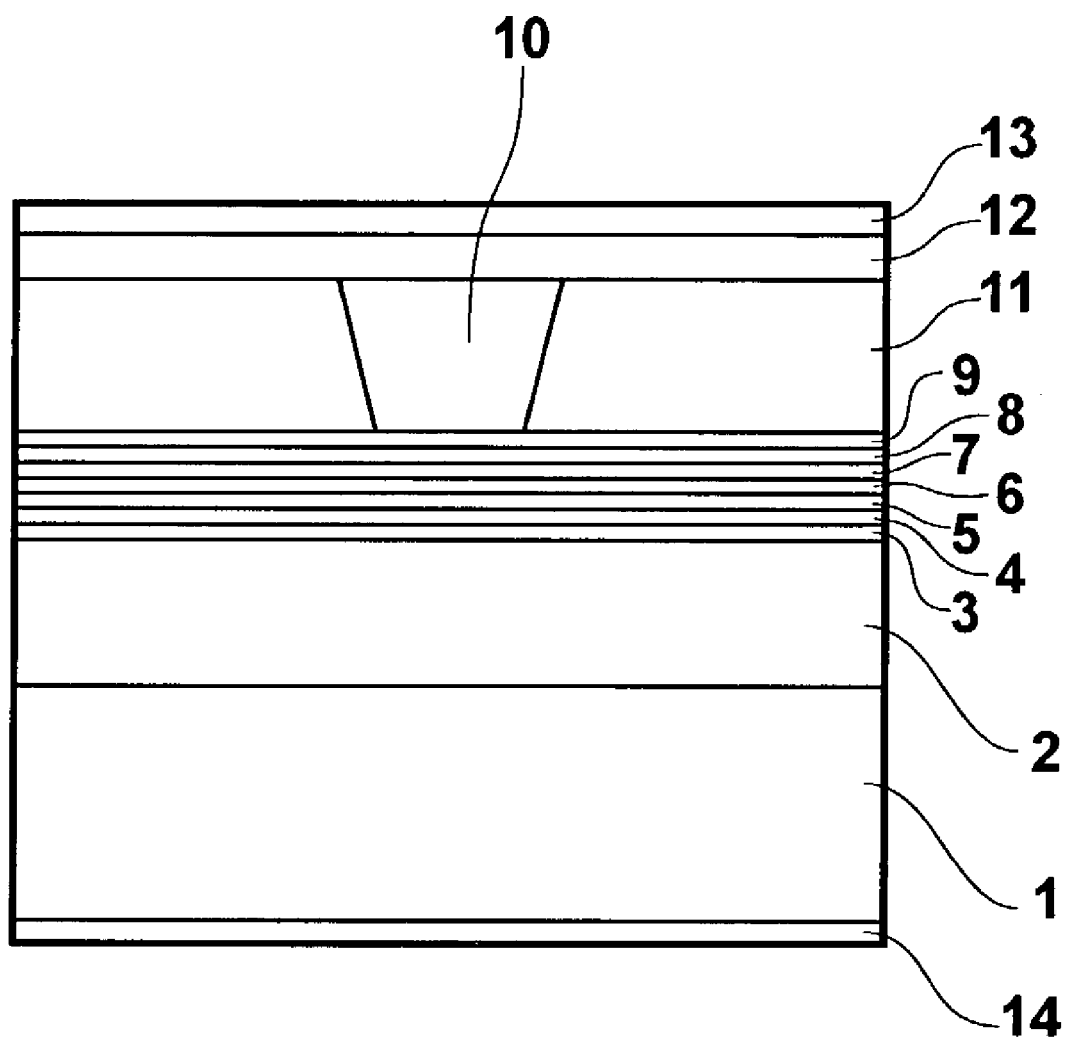
FIG. 1 is a cross-sectional view of a first example of a semiconductor laser element which constitutes a second-harmonic generation device as a first embodiment of the present invention.

As illustrated in FIG. 1, an n-type InGaP lower cladding layer 2, an n-type or intrinsic (i-type) InGaAsP optical waveguide layer 3, an i-type GaAs tensile-strain barrier layer 4, an i-type InGaAs compressive-strain quantum-well active layer 5, an i-type GaAs tensile-strain barrier layer 6, a p-type or i-type InGaAsP optical waveguide layer 7, a p-type InGaP first upper cladding layer 8, a p-type InGaAsP etching stop layer 9, and a p-type InGaP second upper cladding layer 10 are formed on an n-type GaAs substrate 1. Thereafter, a ridge is formed, and an n-type AlGaInP current blocking layer 11 is formed on both sides of the ridge by selective embedding regrowth. Further, a p-type GaAs contact layer 12 is grown, and a p electrode 13 and an n electrode 14 are formed on the upper and lower surfaces of the layered structure.

InGaAs, which is used in the active layer, has a lattice constant greater than that of GaAs. Therefore, a compressive strain is imposed on the active layer, and a tensile strain is imposed on the barrier layers, which is made of InGaAs.

When the InGaAs quantum-well active layer is used, the oscillation wavelength 1 can be controlled within the range of 0.9 to 1.2 micrometers.

In the semiconductor laser element as the first example, the resonator length is 900 micrometers, the reflectances of the two end facets are 20%, and the mirror loss is 17.9 cm$^{-1}$.

The present inventor has measured a width within which the wavelength of the above semiconductor laser element can be controlled, by returning light emitted from one of the end facets with an external diffraction grating, and changing the angle of the diffraction grating. According to the measurement, an average value of the width within which the wavelength can be controlled is 12 nm.

The present inventor has also measured a width within which the wavelength of another semiconductor laser element prepared for comparison can be varied, where this semiconductor laser element has the same layered structure as the above semiconductor laser element as the first example, a reflectance of 30% at each of two end facets, a mirror loss of 13.4 cm$^{-1}$, and a resonator length of 900 micrometers. According to the measurement, the width within which the wavelength of the semiconductor laser element prepared for comparison can be varied is as small as 8 nm.

By comparison of the above results, it is recognized that the width within which the wavelength can be controlled is remarkably extended by the increase in the mirror loss (realized by the decrease in the reflectances) even when the resonator length (900 micrometers) is not changed.

Figure 2:
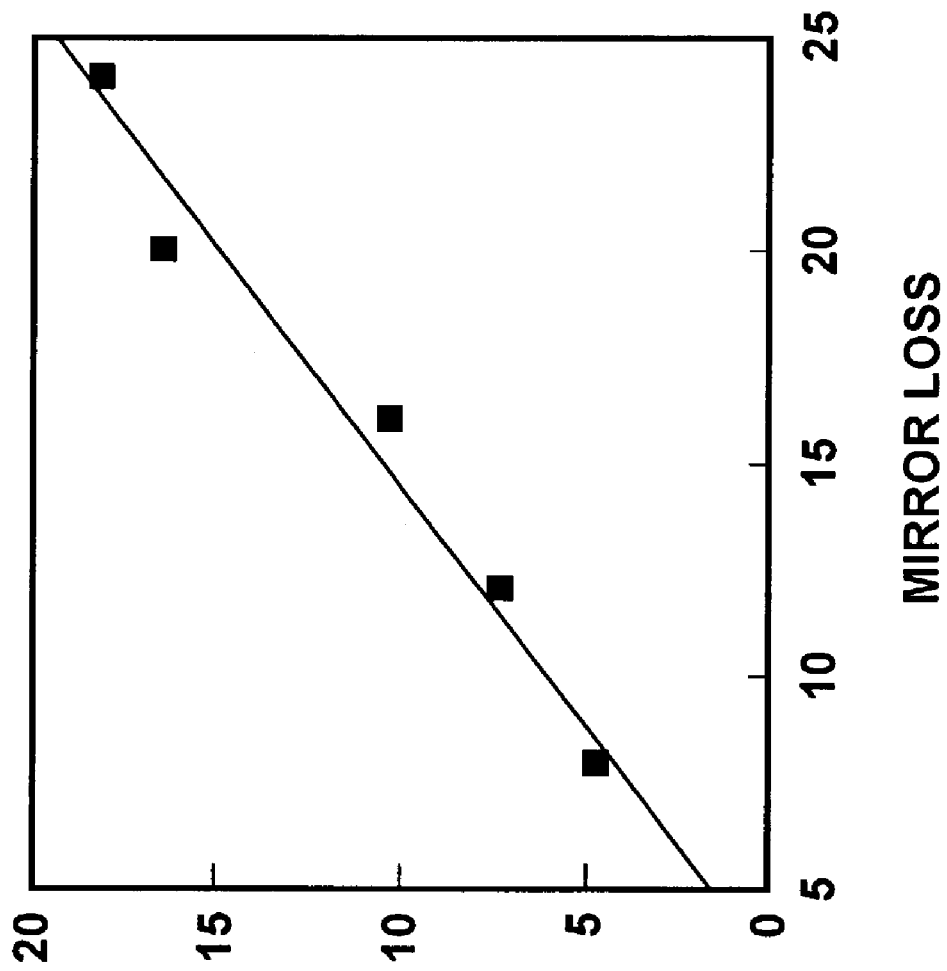
FIG. 2 is a graph indicating a relationship between the mirror loss and the width within which the oscillation wavelength of the semiconductor laser element can be varied.

FIG. 2 is a graph indicating a relationship between the mirror loss and the width within which the oscillation wavelength of a semiconductor laser element can be varied. In the case where the manufacturing variations in oscillation wavelengths of semiconductor laser elements are about 10 nm, the width within which the oscillation wavelength can be varied is required to be at least 10 nm in order to make all manufactured semiconductor laser elements usable. FIG. 2 shows that a mirror loss of 16 cm$^{-1}$ or greater is required for obtaining a value of 10 nm or greater as the width within which the oscillation wavelength can be varied.

Figure 3:
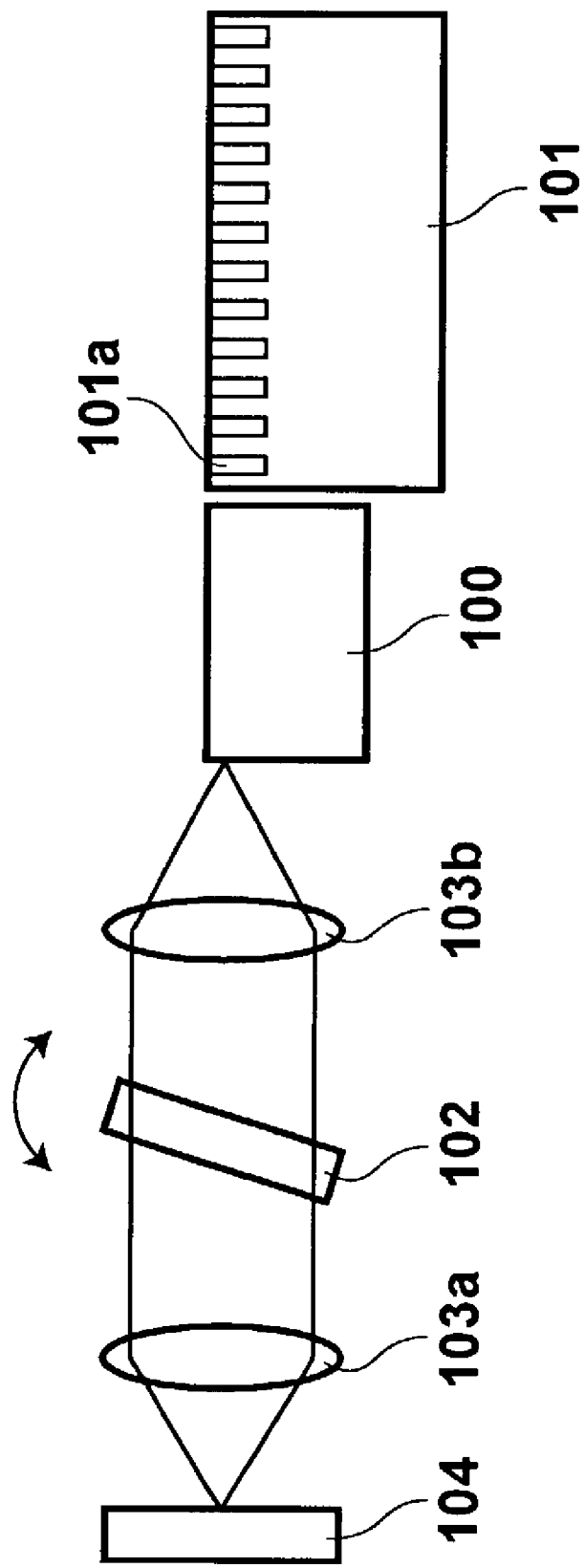
FIG. 3 is a schematic diagram illustrating the second-harmonic generation device as the first embodiment of the present invention.

Next, the second-harmonic generation device as the first embodiment of the present invention is explained below. FIG. 3 is a schematic diagram illustrating the second-harmonic generation device as the first embodiment.

As illustrated in FIG. 3, the second-harmonic generation device as the first embodiment comprises a semiconductor laser element 100, a wavelength conversion element 101, a wavelength selection filter 102, lenses 103a and 103b, and a high-reflectance mirror 104. The semiconductor laser element 100 is, for example, the semiconductor laser element illustrated in FIG. 1. The wavelength conversion element 101 is made of a ferroelectric material exhibiting a nonlinear optical effect, and polarization-inverted portions 101a are formed in the wavelength conversion element 101. The wavelength conversion element 101 is directly coupled to the forward-light-emission end facet (on the right side in FIG. 3) of the semiconductor laser element 100, converts the wavelength of light emitted from the forward-light-emission end facet to a half wavelength, and outputs the light the wavelength of which is converted. The lenses 103a and 103b are arranged on the rear side of the semiconductor laser element 100. The wavelength selection filter 102 is arranged between the lenses 103a and 103b, and controls the wavelength of light emitted from the backward-light-emission end facet of the semiconductor laser element 100. The high-reflectance mirror 104 returns to the semiconductor laser element 100 the light emitted from the backward-light-emission end facet.

In the above construction, the light emitted from the backward-light-emission end facet is collimated by the lenses 103a and 103b, and the wavelength of the light is selected by the wavelength selection filter 102 arranged between the lenses 103a and 103b. The light after the wavelength selection is returned by the high-reflectance mirror 104 to the semiconductor laser element 100, and a second harmonic is generated by the wavelength conversion element 101.

The present inventor has performed a reliability test of the first example of the semiconductor laser element used in the second-harmonic generation device as the first embodiment in order to measure the lifetime of the first example of the semiconductor laser element. In the test, the second-harmonic generation device is automatically controlled so as to maintain the intensity of the second harmonic at 10 mW, the semiconductor laser element 100 is driven so as to operate with the optical output power of 100 mW, and the environmental temperature is maintained at 70° C. Through the test, the present inventor has confirmed that the first example of the semiconductor laser element stably operates for 10,000 or more hours. That is, high reliability of the first example of the semiconductor laser element has been confirmed. In addition, due to the increase in the width within which the oscillation wavelength can be varied, a yield rate of about 90% has been achieved.

On the other hand, when second-harmonic generation devices are produced by using the aforementioned semiconductor laser element prepared for comparison (having the resonator length of 900 micrometers and a reflectance of 30% at each end facet), the yield rate is as small as about 50%, and therefore the cost is increased.

Next, a second example of the semiconductor laser element which constitutes the second-harmonic generation device as the first embodiment of the present invention is explained below with reference to FIG. 4, which is a perspective view of the second example of the semiconductor laser element which constitutes the second-harmonic generation device as the first embodiment.

Figure 4:
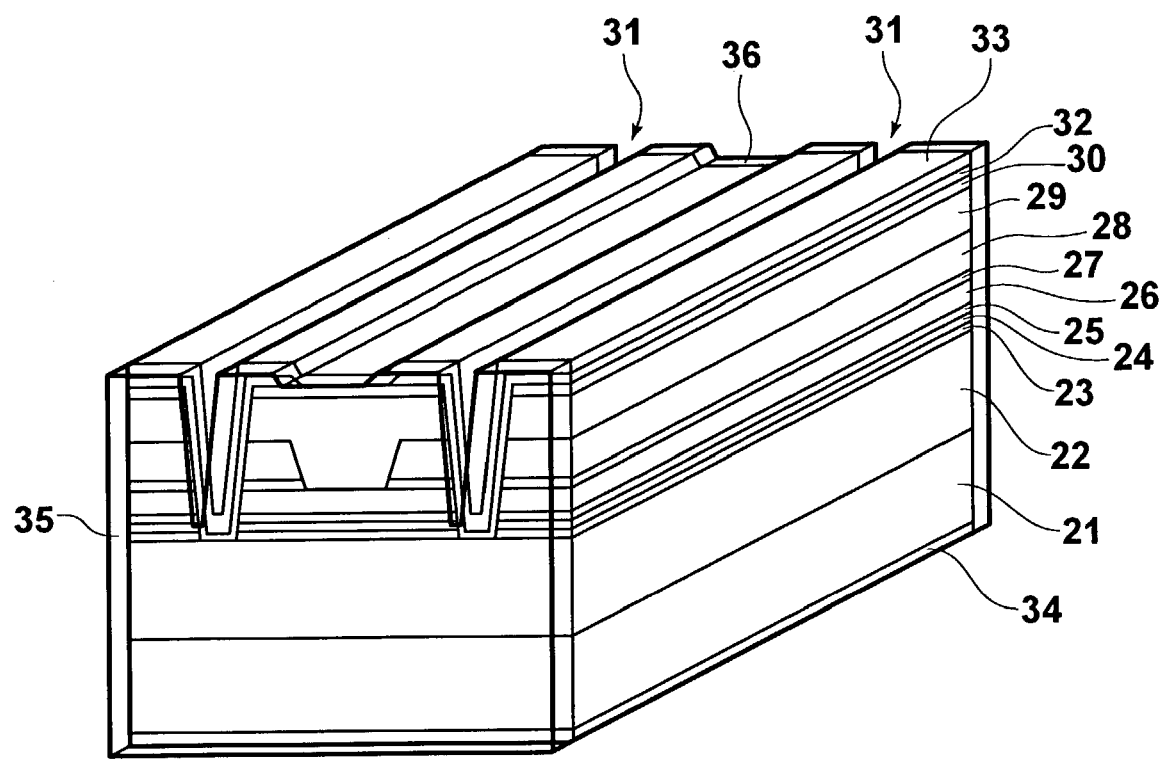
FIG. 4 is a perspective view of a second example of the semiconductor laser element which constitutes the second-harmonic generation device as the first embodiment of the present invention.

As illustrated in FIG. 4, an n-type AlGaAs lower cladding layer 22, an n-type or i-type InGaAsP optical waveguide layer 23, an i-type InGaAs compressive-strain quantum-well active layer 24, a p-type or i-type InGaAsP optical waveguide layer 25, a p-type InGaP first upper cladding layer 26, a p-type InGaAsP etching stop layer 27, and an n-type InGaP current blocking layer 28 are formed on an n-type GaAs substrate 21, where stripe areas of the p-type InGaAsP etching stop layer 27 and the n-type InGaP current blocking layer 28 corresponding to a stripe region are removed. Over the above layered structure, a p-type AlGaAs second upper cladding layer 29, a p-type GaAs contact layer 30, an insulation film 32, and a p electrode 33 are formed, where the insulation film 32 is not formed in a stripe area corresponding to the stripe region. In addition, an n electrode 34 is formed on the back surface of the n-type GaAs substrate 21. Further, a pair of trenches 31 are formed on both sides of the stripe region in order to reduce parasitic capacitances.

Furthermore, reflection coatings 35 and 36 are applied to opposite end facets so as to realize reflectances of 20% and 10% at the opposite end facets, respectively. The resonator length is 1.2 mm, and the mirror loss is 16.3 $cm^{-1}$.

The present inventor has performed an experiment on the wavelength control of the above semiconductor laser element by returning light to the semiconductor laser element with an external diffraction grating. In the experiment, a value of 10 nm has been obtained as the width within which the oscillation wavelength can be varied.

In addition, the present inventor has produced another semiconductor laser for comparison with the above semiconductor laser element as the second example. The semiconductor laser element produced for comparison has the same layered structure and the same mirror loss (16.3 $cm^{-1}$) as the second example of the semiconductor laser element, a reflectance of 30% at each of two end facets, and a resonator length of 750 micrometers. The present inventor has also measured a width within which the wavelength of the above semiconductor laser element produced for comparison can be varied. According to the measurement, the width within which the wavelength of this semiconductor laser element produced for comparison can be varied is 10 nm.

In addition, the present inventor has performed a reliability test of the second example of the semiconductor laser element and the above semiconductor laser element produced for comparison in order to measure the lifetimes of these semiconductor laser elements. In this test, the semiconductor laser elements are driven so as to operate with the optical output power of 100 mW, and the environmental temperature is maintained at 70° C. In this test, deterioration of the semiconductor laser element produced for comparison has been observed before the elapse of 100 hours. On the other hand, the present inventor has confirmed that all samples of the second example of the semiconductor laser element stably operate for 5,000 or more hours. It is possible to consider that the reliability of the second example of the semiconductor laser element is high because the resonator length is increased and the operating current density is decreased. That is, the lifetimes of semiconductor laser elements depend on their resonator lengths even when the semiconductor laser elements have an identical mirror loss of 16 $cm^{-1}$ or greater.

As explained above, when a semiconductor laser element constituting a second-harmonic generation device has a resonator length of 900 micrometers or greater and a mirror loss of 16 $cm^{-1}$ or greater, it is possible to obtain a value of 10 nm or greater as the width within which the wavelength of the semiconductor laser element can be varied. Therefore, in this case, the wavelength control becomes easy, and the conversion efficiency in the combination of the semiconductor laser element and the wavelength conversion element can be increased. Thus, it is possible to obtain a stable second harmonic and achieve high reliability. In addition, since a desired second harmonic can be stably obtained, the yield rate of the second-harmonic generation device can be increased, and the cost can be reduced.

Second and Third Embodiments

A semiconductor laser element as the second embodiment of the present invention, which corresponds to the aforementioned second aspect of the present invention, is explained below with reference to FIG. 5, which is a perspective view of the semiconductor laser element as the second embodiment.

Figure 5:
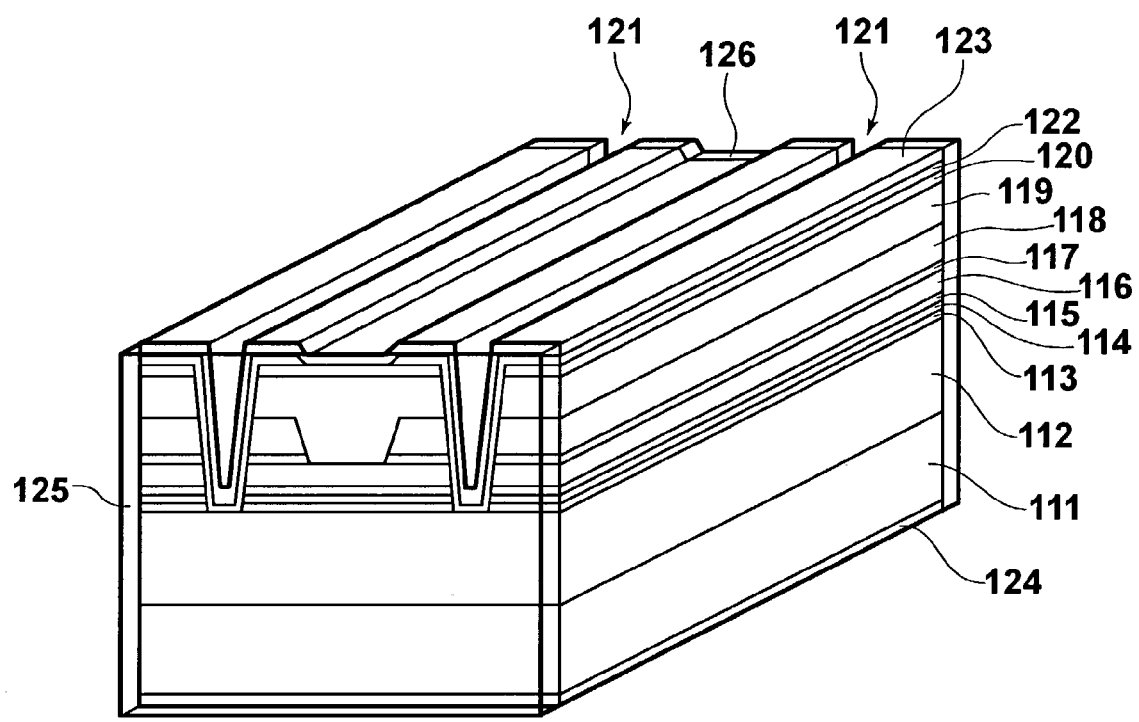
FIG. 5 is a perspective view of a semiconductor laser element as a second embodiment of the present invention.

As illustrated in FIG. 5, the semiconductor laser element as the second embodiment comprises an n-type $Al_{0.52}Ga_{0.48}As$ lower cladding layer 112, an i-type InGaAsP lower optical waveguide layer 113, an i-type InGaAs compressive-strain quantum-well active layer 114, an i-type InGaAsP upper optical waveguide layer 115, a p-type $In_{0.49}Ga_{0.51}P$ first upper cladding layer 116, a p-type InGaAsP etching stop layer 117, and an n-type AlGaInP current blocking layer 118 are formed on an n-type GaAs substrate 111, where stripe areas of the p-type InGaAsP etching stop layer 117 and the n-type AlGaInP current blocking layer 118 corresponding to a stripe region are removed. Over the above layered structure, a p-type $In_{0.49}Ga_{0.51}P$ second upper cladding layer 119, a p-type GaAs contact layer 120, an insulation film 122, and a p electrode 123 are formed, where the insulation film 122 is not formed in a stripe area corresponding to the stripe region. In addition, an n electrode 124 is formed on the back surface of the n-type GaAs substrate 111. Further, a pair of trenches 121 are formed on both sides of the stripe region in order to reduce parasitic capacitances, and reflection coatings 125 and 126 are applied to opposite end facets.

In the light emission region sandwiched between the lower and upper cladding layers, the lower and upper optical waveguide layers 113 and 115 and the i-type InGaAs compressive-strain quantum-well active layer 114 realize an SCH (separate-confinement heterostructure) structure. In addition, it is preferable that the lower and upper cladding layers have compositions which lattice-match with GaAs.

A method for designing and producing the above semiconductor laser element as the second embodiment is explained below.

Wet etching is used in both of a step of etching the n-type AlGaInP current blocking layer 118 for forming an optical waveguide and a step for forming the pair of trenches for reducing parasitic capacitances. In these steps, the following characteristic of etching which uses a hydrochloric acid etchant is utilized. That is, when InGaP and AlGaInP are etched with hydrochloric acid, the amount of lateral extension of etching under the mask is reduced by the influence of anisotropy with respect to the surface orientation. This is a phenomenon unique to the combinations of the InGaP-based materials and hydrochloric acid.

The difference in the lateral extension of etching under the mask depending on the material of the upper cladding layer is indicated below with reference to FIGS. 6A to 6F. FIGS. 6A to 6C are cross-sectional views of representative stages of a process of etching an AlGaAs cladding layer by using a mask 135, and FIGS. 6D to 6F are cross-sectional views of representative stages of a process of etching an InGaP cladding layer by using a mask 135.

In the process illustrated in FIGS. 6A to 6C, an active layer 132 and an upper cladding layer 133 are formed on a lower cladding layer 131. The upper cladding layer 133 is made of AlGaAs, and includes an etching stop layer 134 at its mid-thickness. On the other hand, the process illustrated in FIGS. 6D to 6F is different from the process illustrated in FIGS. 6A to 6C in that the upper cladding layer 133Õ is made of InGaP instead of AlGaAs.

Although a substantial amount of side etching occurs under the mask 135 in the case where the upper cladding layer is made of AlGaAs as illustrated in FIGS. 6A to 6C, almost no side etching occurs under the mask 135 in the case where the upper cladding layer is made of InGaP as illustrated in FIGS. 6D to 6F. That is, when a cladding layer or a current blocking layer which are to be processed are made of AlGaAs, a substantial amount of side etching occurs, and therefore the control of the groove width becomes difficult. In contrast, when the cladding layer or the current blocking layer to be processed are made of InP, InGaP, or AlGaInP, which are superior to other materials in processibility, it is possible to enhance the reproducibility of the process and the accuracy in etching.

On the other hand, from a manufacturing viewpoint, it is preferable that the lower cladding layer, which is formed nearer to the substrate than the upper cladding layer, is made of AlGaAs rather than InGaP. Since only phosphorus is a group-V element in InGaP, InGaP is thermally unstable compared with AlGaAs, and is prone to deterioration in crystallinity. In particular, in the case where an arsenic compound such as InGaAsP is formed on InGaP by MOCVD crystal growth, phosphorus at the surface of an InGaP layer which is first grown is replaced with arsenic, and therefore the quality of an InGaAsP crystal which is subsequently grown deteriorates. In contrast, since AlGaAs contains arsenic as a group-V element, AlGaAs is thermally stable. Therefore, when InGaAsP is grown subsequently to the AlGaAs layer, it is easy to obtain a high-quality crystal.

From the general viewpoint of design of a semiconductor laser element, it seems natural to form a lower cladding layer of InGaP when the upper cladding layer is made of InGaP. However, for the reasons explained above, use of AlGaAs in the lower cladding layer is advantageous in high crystallinity, and use of InGaP in the upper cladding layer is advantageous in high processibility. Thus, when the lower cladding layer is made of AlGaAs and the upper cladding layer made of is InGaP, it is possible to realize a semiconductor laser element which is superior in characteristics and cost.

In addition, when the AlGaAs used in the lower cladding layer and the InGaP used in the upper cladding layer are arranged to have an identical refractive index, it is possible to make the same optical design as that is made in the case where the lower and upper cladding layers are made of an identical semiconductor material.

Incidentally, a portion of the p-type InGaAsP etching stop layer 117 may be left in the structure of the semiconductor laser element as the second embodiment.

Figure 7:
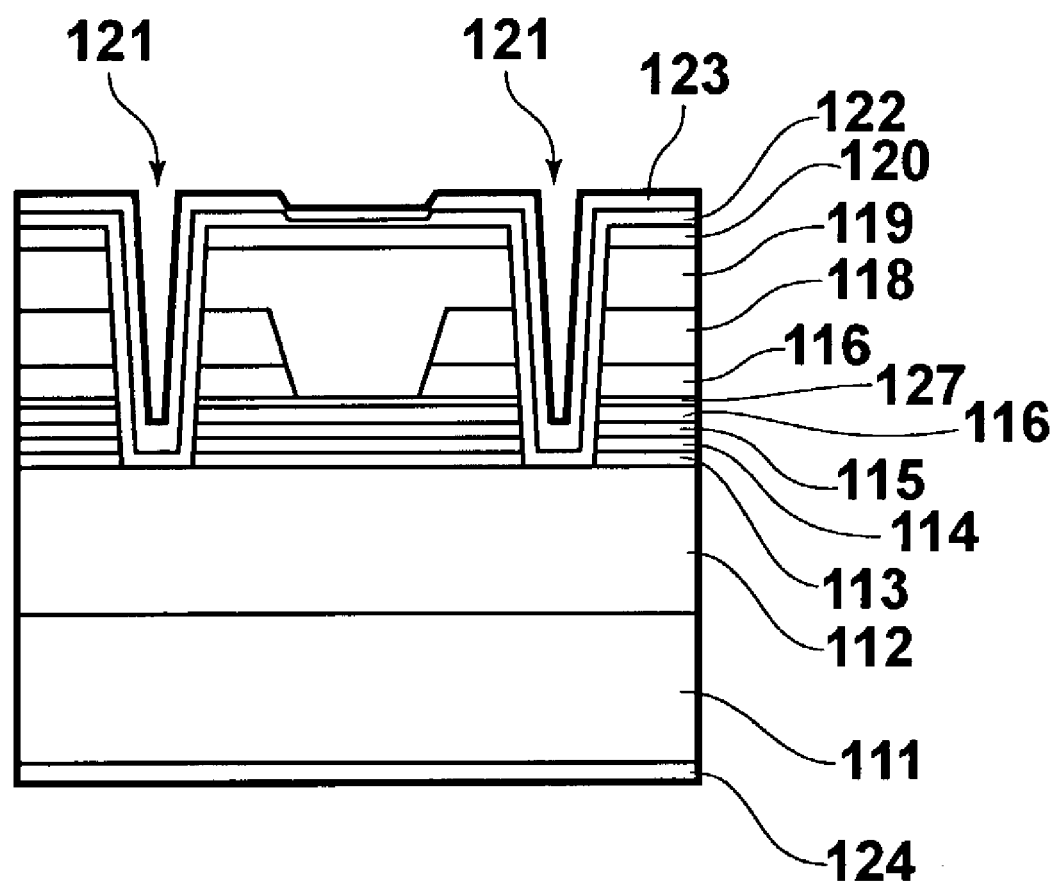
FIG. 7 is a cross-sectional view of a semiconductor laser element as a first variation of the second embodiment of the present invention.

Further, as illustrated in FIG. 7, an etching stop layer 127 which is made of, for example, InGaAsP may be formed at a mid-thickness of the p-type $In_{0.49}Ga_{0.51}P$ first upper cladding layer 116. In this case, it is possible to decrease the distance between the upper cladding layer and the active layer, and increase the difference in the equivalent refractive index between the stripe region and the other regions. Therefore, higher-quality laser light can be obtained.

Figure 8:
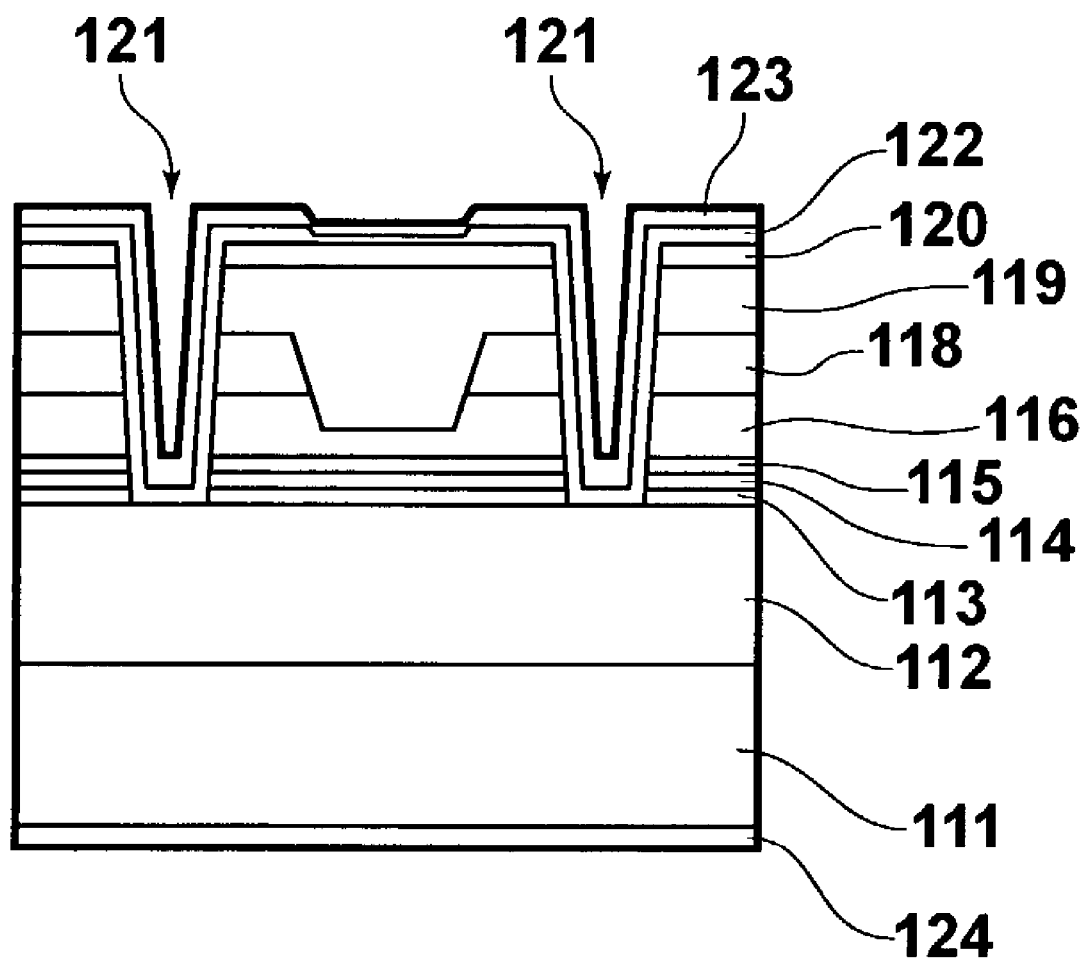
FIG. 8 is a cross-sectional view of a semiconductor laser element as a second variation of the second embodiment of the present invention.

Furthermore, as illustrated in FIG. 8, the p-type InGaAsP etching stop layer 117 can be dispensed with. That is, it is allowable that a portion of the p-type $In_{0.49}Ga_{0.51}P$ first upper cladding layer 116 is etched. In such a structure, the thickness of the i-type InGaAsP upper optical waveguide layer 115 is increased. Therefore, the optical density is reduced, and the level of the optical output power above which facet degradation occurs can be raised. Thus, the lifetime of the semiconductor laser element can be increased.

Although, in the construction of FIG. 5, the lower cladding layer 112 is made of AlGaAs, and the first upper cladding layer 116 and the second upper cladding layer 119 are made of InGaP, the second upper cladding layer 119 may be made of AlGaAs (e.g., p-type $Al_{0.52}Ga_{0.48}As$) instead of p-type $In_{0.49}Ga_{0.51}P$.

Next, a semiconductor laser element as the third embodiment of the present invention, which also corresponds to the aforementioned second aspect of the present invention, is explained below with reference to FIG. 9, which is a cross-sectional view of the semiconductor laser element as the third embodiment.

Figure 9:
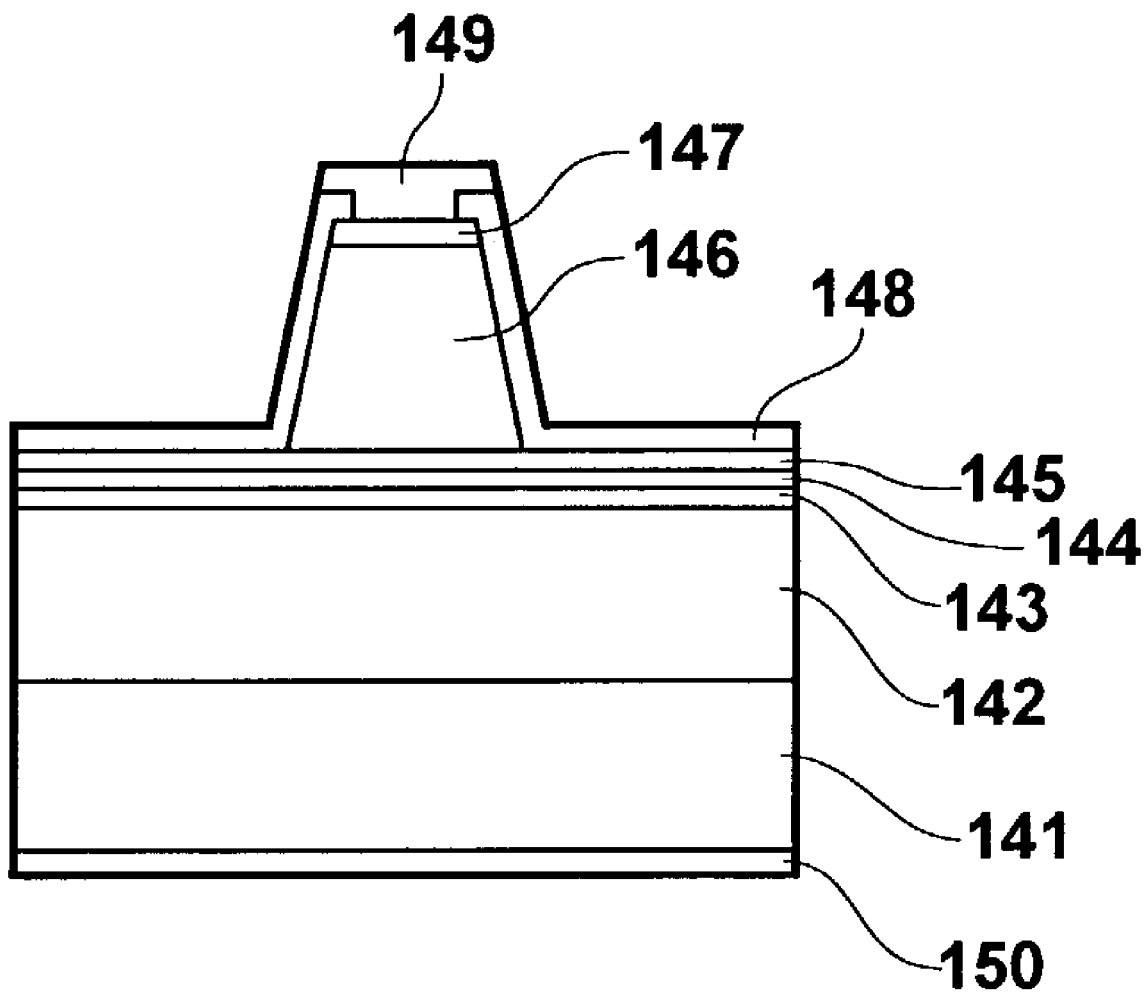
FIG. 9 is a cross-sectional view of a semiconductor laser element as a third embodiment of the present invention.

As illustrated in FIG. 9, the semiconductor laser element as the third embodiment comprises an n-type $Al_{0.52}Ga_{0.48}As$ lower cladding layer 142, an i-type InGaAsP lower optical waveguide layer 143, an i-type InGaAs compressive-strain quantum-well active layer 144, an i-type InGaAsP upper optical waveguide layer 145, a p-type $In_{0.49}Ga_{0.51}P$ upper cladding layer 146, a p-type GaAs contact layer 147, an insulation film 148, and a p electrode 149 are formed on an n-type GaAs substrate 141, where portions of the p-type $In_{0.49}Ga_{0.51}P$ upper cladding layer 146 are etched off so as to form a ridge structure. In addition, an n electrode 150 is formed on the back surface of the n-type GaAs substrate 141.

Since, in the semiconductor laser element as the third embodiment, the upper cladding layer 146 is made of $In_{0.49}Ga_{0.51}P$, and the upper optical waveguide layer 145 is made of InGaAsP, it is possible to make etching of the upper cladding layer 146 automatically stop at the upper boundary of the upper optical waveguide layer 145. In addition, since only a very small amount of side etching occurs in the etching of InGaP, a highly accurate ridge structure can be formed, and therefore a highly reliable semiconductor laser element can be obtained.

Figure 10:
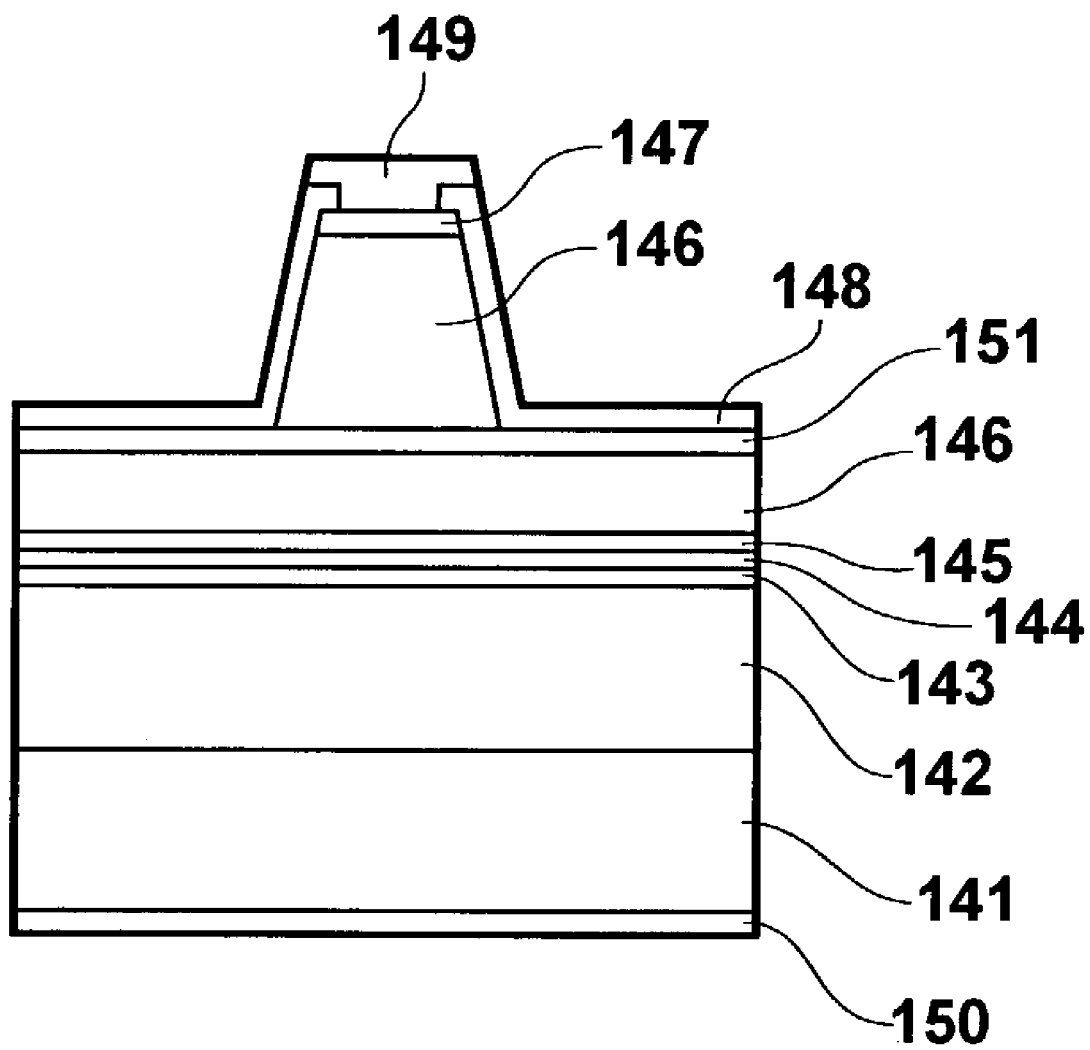
FIG. 10 is a cross-sectional view of a semiconductor laser element as a variation of the third embodiment of the present invention.

Further, as illustrated in FIG. 10, an etching stop layer 151 made of InGaAsP may be formed at a mid-thickness of the p-type $In_{0.49}Ga_{0.51}P$ upper cladding layer 146. In this case, it is possible to increase the great difference in the equivalent refractive index between the stripe region and the other regions. Therefore, high-quality laser light can be obtained.

In each of the semiconductor laser elements as the second and third embodiments, one of the upper and lower cladding layers is made of AlGaAs, and the other of the upper and lower cladding layers is made of only InGaP or a combination of InGaP and AlGaAs. Alternatively, it is possible to make at least a portion of one of the cladding layers of AlGaInP, and at least a portion of the other of the upper and lower cladding layers of AlGaAs. Further, it is also possible to make at least a portion of one of the cladding layers of AlGaInAs, and at least a portion of the other of the upper and lower cladding layers of InP.

When one of the upper and lower cladding layers is constituted by a plurality of sublayers, it is sufficient that at least one of the plurality of sublayers is made of a semiconductor material which is different from a semiconductor material of which the other of the upper and lower cladding layers is made. Further, when one of the upper and lower cladding layers which is to be processes is divided into a plurality of portions, and a groove is required to be formed in at least one of the plurality of portions so that the width of the groove is highly controllable, it is preferable to arrange the composition of a semiconductor material realizing the at least one of the plurality of portions so that the semiconductor material is highly processible.

Fourth Embodiment

A semiconductor laser element as the fourth embodiment of the present invention, which corresponds to the aforementioned third aspect of the present invention, is explained below with reference to FIG. 11, which is a perspective view of the semiconductor laser element as the fourth embodiment.

Figure 11:
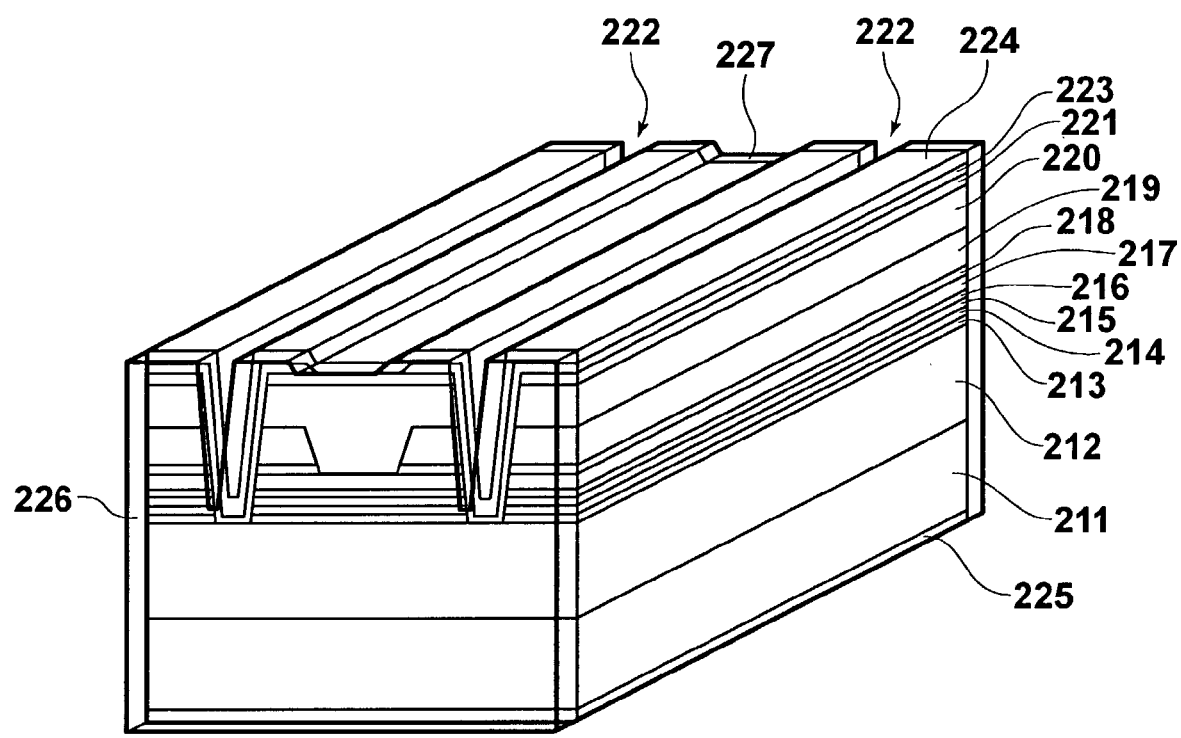
FIG. 11 is a perspective view of a semiconductor laser element as a fourth embodiment of the present invention.

As illustrated in FIG. 11, the semiconductor laser element as the fourth embodiment comprises an n-type $Al_{0.52}Ga_{0.48}As$ lower cladding layer 212 (having a Si concentration of $1\times10^{18}$ cm$^{-3}$ and a thickness of 2.0 micrometers), an n-type or i-type InGaAsP lower optical waveguide layer 213 (having a thickness of 50 nm), an i-type $In_{0.2}Ga_{0.8}As$ compressive-strain quantum-well active layer 214 (having a thickness of 7 nm), an i-type InGaAsP upper optical waveguide layer 215 (having a thickness of 50 nm), a low-concentration sublayer 216 (having a Zn concentration of $1\times10^{17}$ cm$^{-3}$ and a thickness of 5 nm) of a p-type $In_{0.49}Ga_{0.51}P$ first upper cladding layer, a high-concentration sublayer 217 (having a Zn concentration of $1\times10^{18}$ cm$^{-3}$ and a thickness of 0.2 micrometers) of the p-type $In_{0.49}Ga_{0.51}P$ first upper cladding layer, a p-type InGaAsP etching stop layer 218 (having a Zn concentration of $7\times10^{17}$ cm$^{-3}$ and a thickness of 5 nm), an n-type InGaP current blocking layer 219 (having a Si concentration of $7\times10^{17}$ cm$^{-3}$ and a thickness of 1.0 micrometers), a p-type $Al_{0.47}Ga_{0.53}As$ second upper cladding layer 220 (having a Zn concentration of $1\times10^{18}$ cm$^{-3}$ and a thickness of 1.5 micrometers), a p-type GaAs contact layer 221 (having a Zn concentration of $5\times10^{19}$ cm$^{-3}$ and a thickness of 0.1 micrometers), an insulation film 223, and a p electrode 224 are formed on an n-type GaAs substrate 211, where the p-type InGaAsP etching stop layer 218, the n-type InGaP current blocking layer 219, and the insulation film 223 are not formed in stripe areas corresponding to a current-injection region. In addition, an n electrode 225 is formed on the back surface of the n-type GaAs substrate 211. Further, a pair of trenches 222 are formed on both sides of the striped emission region (having a width of 2.0 micrometers) in order to reduce parasitic capacitances, and reflection coatings 226 and 227 are applied to opposite end facets so as to realize reflectances of 3% and 95% at the opposite end facets, respectively. The interval between the pair of trenches 222 is 100 micrometers, the resonator length is 1.2 mm, and the oscillation wavelength is 0.98 micrometers.

In the above semiconductor laser element as the fourth embodiment, the bandgaps of the lower and upper optical waveguide layers are 1.6 eV, and the total thickness of the lower and upper optical waveguide layers is 100 nm.

In the construction of FIG. 11, the low-concentration sublayer 216 (having a Zn concentration of $1\times10^{17}$ cm$^{-3}$ and a thickness of 5 nm) of the p-type $In_{0.49}Ga_{0.51}P$ first upper cladding layer, the high-concentration sublayer 217 (having a Zn concentration of $1\times10^{18}$ cm$^{-3}$) of the p-type $In_{0.49}Ga_{0.51}P$ first upper cladding layer, and the p-type $Al_{0.47}Ga_{0.53}As$ second upper cladding layer 220, which is formed on the current blocking layer 219, are p-type cladding layers.

The present inventor has measured a current-optical output power characteristic of the semiconductor laser element as the fourth embodiment. According to the measurement, the present inventor has observed the maximum optical output power of 700 mW, and confirmed that the semiconductor laser element operate in a single transverse mode with the optical output power up to 500 mW. In addition, the present inventor has also measured a temperature characteristic of the semiconductor laser element, and obtained a satisfactory value of 180 K as the characteristic temperature ($T_0$) in the temperature range of 20 to 80° C.

Figure 12:
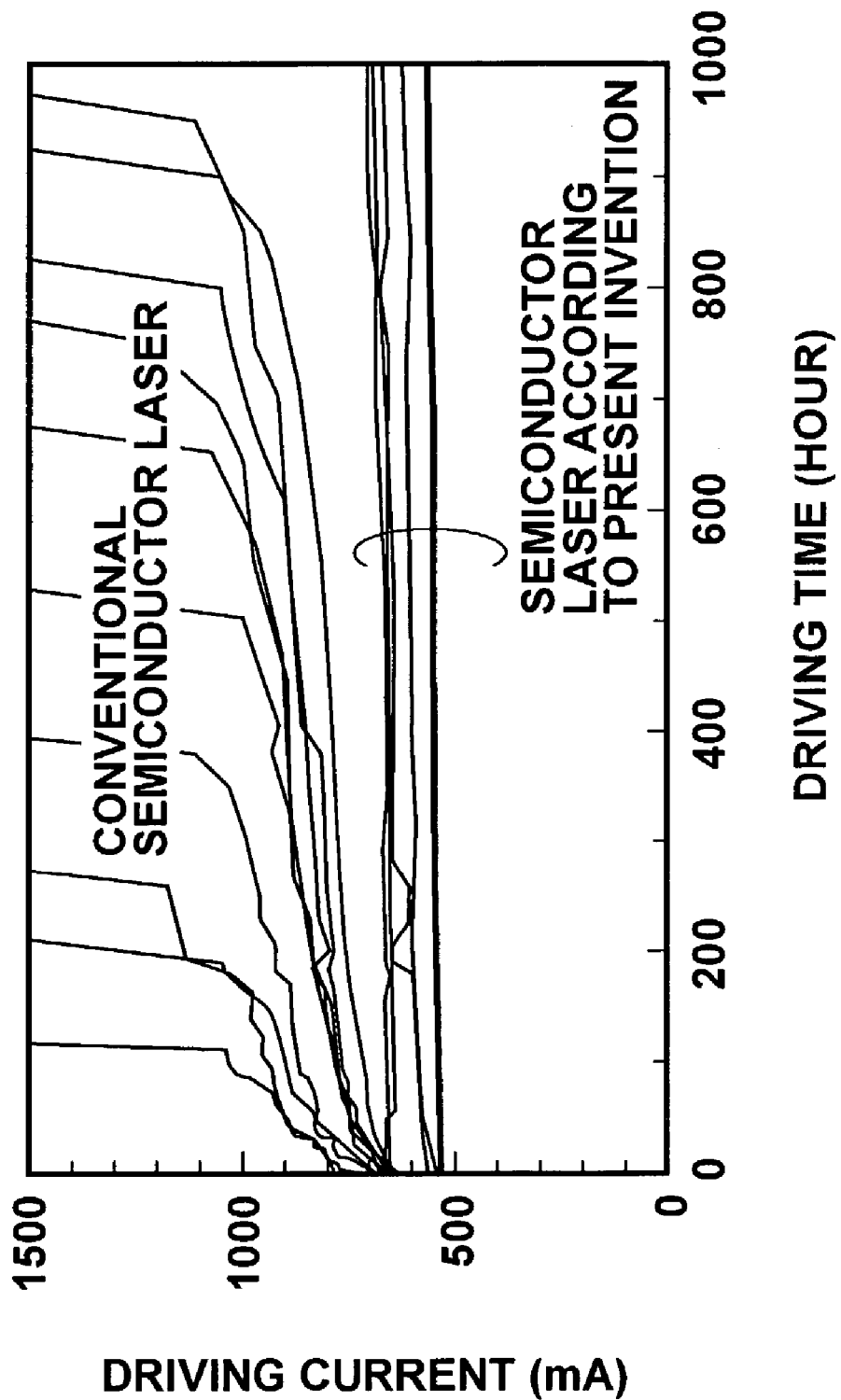
FIG. 12 is a graph indicating a result of a reliability test of a conventional semiconductor laser element and a semiconductor laser element as the fourth embodiment of the present invention.

FIG. 12 is a graph indicating a result of a reliability test of a conventional semiconductor laser element and the semiconductor laser element as the fourth embodiment. The conventional semiconductor laser element subject to the test is different from the semiconductor laser element of FIG. 11 in that the conventional semiconductor laser element does not have the low-concentration sublayer 216 of the p-type $In_{0.49}Ga_{0.51}P$ first upper cladding layer. In this test, the semiconductor laser elements are driven under automatic power control (APC) so as to operate with the optical output power of 300 mW, and the environmental temperature is maintained at 70° C.

As indicated in FIG. 12, the present inventor has confirmed that samples of the semiconductor laser element as the fourth embodiment stably operate for 1,000 hours. On the other hand, FIG. 12 shows that samples of the conventional semiconductor laser element significantly deteriorate during the test, and have short lifetimes. It is considered that Zn ions in the high-concentration, p-type first upper cladding layer in the conventional semiconductor laser element diffuse into the active layer, and become non-radiative recombination centers which increase the absorption coefficient and defects.

Based on the reliability test, the present inventor has estimated lifetimes of samples of the semiconductor laser element as the fourth embodiment corresponding to various combinations of values of the thickness of the low-concentration sublayer 216 of the p-type $In_{0.49}Ga_{0.51}P$ first upper cladding layer and the impurity concentration of the high-concentration sublayer 217 of the p-type $In_{0.49}Ga_{0.51}P$ first upper cladding layer, and Table 1 shows the estimated lifetimes. The values of the thickness of the low-concentration sublayer 216 of the p-type $In_{0.49}Ga_{0.51}P$ first upper cladding layer in the tested samples are 0, 5, 10, 12, 30, and 100 nm, and the values of the Zn concentration of the high-concentration sublayer 217 of the p-type $In_{0.49}Ga_{0.51}P$ first upper cladding layer in the tested samples are $3\times10^{17}$, $7\times10^{17}$, $1\times10^{18}$, and $2\times10^{18}$ cm$^{-3}$. In addition, the Zn concentration of the low-concentration sublayer 216 of the p-type $In_{0.49}Ga_{0.51}P$ first upper cladding layer in the tested samples is $1\times10^{17}$ cm$^{-3}$, the environmental temperature is 70° C., and the optical output power is 100 mW.

As indicated in Table 1, the lifetimes of the samples are remarkably long when the thickness of the low-concentration sublayer 216 of the p-type $In_{0.49}Ga_{0.51}P$ first upper cladding layer is in the range from 5 to 12 nm, and the Zn concentration of the high-concentration sublayer 217 of the p-type $In_{0.49}Ga_{0.51}P$ first upper cladding layer is in the range from $7\times10^{17}$ to $2\times10^{18}$ cm$^{-3}$. Further, the present inventor has confirmed that similar results are obtained even when the Zn concentration of the low-concentration sublayer 216 of the p-type $In_{0.49}Ga_{0.51}P$ first

TABLE 1

Estimated Lifetimes of Semiconductor Laser Elements

| Thickness of Low-concentration Sublayer (nm) | Zn Concentration in High-concentration Sublayer (cm$^{-3}$) | | | |
|---|---|---|---|---|
| | $3\times10^{17}$ | $7\times10^{17}$ | $1\times10^{18}$ | $2\times10^{18}$ |
| 0 | 3,000 | 9,000 | 11,000 | 9,000 |
| 5 | | 70,000 | 100,000 | |
| 10 | | 63,000 | 110,000 | 200,000 |
| 12 | | 30,000 | 100,000 | 160,000 |
| 30 | | | 100,000 | 10,000 |
| 100 | | | 5,000 | | upper cladding layer is lower than $1\times10^{17}$ cm$^{-3}$. That is, when the thickness of the low-concentration sublayer 216 of the p-type $In_{0.49}Ga_{0.51}P$ first upper cladding layer and the Zn concentration of the high-concentration sublayer 217 of the p-type $In_{0.49}Ga_{0.51}P$ first upper cladding layer are finely controlled, the lifetime of the semiconductor laser element can be remarkably increased.

Additional Matters (i) Since the optical output power and reliability of the semiconductor laser elements according to the second and third aspects of the present invention are high, the semiconductor laser elements according to the second and third aspects of the present invention can be used as light sources in high-performance devices for information or image processing, and the like.

(ii) In addition, all of the contents of the Japanese patent applications Nos. are incorporated into this specification by reference.

What is claimed is:

1. A semiconductor laser element comprising:
a substrate;
a first cladding layer formed on said substrate;
an active layer formed on said first cladding layer; and
a second cladding layer formed on said active layer;
wherein at least a portion of said first cladding layer is made of AlGaAs or AlGaInAs, at least a portion of said second cladding layer is made of one of InP, InGaP, and AlGaInP, and said portions of said first and second cladding layers have approximately identical refractive indexes.

2. A semiconductor laser element according to claim 1, wherein at least said portion of said first cladding layer is made of AlGaAs, and at least said portion of said second cladding layer is made of InGaP.

3. A semiconductor laser element according to claim 1, wherein at least said portion of said first cladding layer is made of AlGaAs, and at least said portion of said second cladding layer is made of AlGaInP.

4. A semiconductor laser element according to claim 1, wherein at least said portion of said first cladding layer is made of AlGaInAs, and at least said portion of said second cladding layer is made of InP.

5. A semiconductor laser element comprising:
a substrate made of n-type GaAs;
a lower cladding layer formed above said substrate and made of n-type AlGaAs;
a lower optical waveguide layer formed above said lower cladding layer and made of n-type or undoped InGaAsP;
a strained quantum-well active layer formed above said lower optical waveguide layer and made of InGaAs;
an upper optical waveguide layer formed above said strained quantum-well active layer and made of undoped InGaAsP; and
an upper cladding layer formed above said upper optical waveguide layer and made of p-type InGaP;
where each of said lower and upper optical waveguide layers has such a composition as to realize a bandgap of 1.5 to 1.6 eV,
said lower and upper optical waveguide layers have a total thickness of 100 to 200 nm, said upper cladding layer contains Zn as a dopant, and
at least a portion of the upper cladding layer located nearer to said strained quantum-well active layer includes,
a low-concentration sublayer having a Zn concentration of $1\times10^{15}$ to $1\times10^{17}$ cm$^{-3}$ and a thickness of 5 to 12 nm,
and a high-concentration sublayer having a Zn concentration of $7\times10^{17}$ to $2\times10^{18}$ cm$^{-3}$ and being located farther from the active layer than the low-concentration sublayer.

6. A second-harmonic generation device comprising:
a semiconductor laser element which has a quantum-well active layer and first and second end facets opposite to each other, and emits light having a wavelength from the first end facet;
a wavelength control means which controls the wavelength of the light emitted from the first end facet;
an optical system which returns to the semiconductor laser element the light the wavelength of which is controlled by the wavelength control means; and
a wavelength conversion element which is directly coupled to the second end facet of the semiconductor laser element, converts the wavelength of the light controlled by the wavelength control means, to a half wavelength, and outputs the light the wavelength of which is converted;
where said semiconductor laser element has a resonator length equal to or greater than 900 micrometers and a mirror loss equal to or greater than 16 cm$^{-1}$, wherein a shape of a beam emitted from the semiconductor laser element matches a shape of a receiving element of the wavelength conversion element.

7. A second-harmonic generation device comprising:
a semiconductor laser element which has a quantum-well active layer and first and second end facets opposite to each other, and emits light having a wavelength from the first end facet;
a wavelength control means which controls the wavelength of the light emitted from the first end facet;
an optical system which returns to the semiconductor laser element the light the wavelength of which is controlled by the wavelength control means; and
a wavelength conversion element which is directly coupled to the second end facet of the semiconductor laser element, converts the wavelength of the light controlled by the wavelength control means, to a half wavelength, and outputs the light the wavelength of which is converted;
where said semiconductor laser element has a resonator length equal to or greater than 900 micrometers and a mirror loss equal to or greater than 16 cm$^{-1}$;
wherein a shape of a beam emitted from the semiconductor laser element has an aspect ratio greater than 1.

8. A second-harmonic generation device according to claim 7, wherein said semiconductor laser element has an oscillation wavelength in a range from 0.9 to 1.2 micrometers.

* * * * *